(12) United States Patent
Laub

(10) Patent No.: US 8,271,929 B2
(45) Date of Patent: Sep. 18, 2012

(54) METHOD FOR CLOCK LOAD ALIGNMENT DURING STANDARD CELL OPTIMIZATION

(75) Inventor: Gustav Laub, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 310 days.

(21) Appl. No.: 12/708,700

(22) Filed: Feb. 19, 2010

(65) Prior Publication Data

US 2011/0209112 A1    Aug. 25, 2011

(51) Int. Cl.
*G06F 17/50* (2006.01)
*G06F 9/455* (2006.01)

(52) U.S. Cl. .................................. 716/132; 716/108

(58) Field of Classification Search .............. 716/108, 716/132

See application file for complete search history.

(56) References Cited

U.S. PATENT DOCUMENTS

| | | | |
|---|---|---|---|
| 6,311,313 B1 * | 10/2001 | Camporese et al. | 716/113 |
| 6,351,840 B1 * | 2/2002 | Teng | 716/122 |
| 6,609,228 B1 * | 8/2003 | Bergeron et al. | 716/113 |
| 6,698,006 B1 * | 2/2004 | Srinivasan et al. | 716/114 |
| 7,017,132 B2 * | 3/2006 | Hou et al. | 716/104 |
| 7,225,421 B2 * | 5/2007 | Migatz et al. | 716/114 |
| 7,461,365 B1 * | 12/2008 | Galbi et al. | 716/138 |
| 2005/0015738 A1 * | 1/2005 | Alpert et al. | 716/10 |
| 2005/0102643 A1 * | 5/2005 | Hou et al. | 716/6 |
| 2006/0190899 A1 * | 8/2006 | Migatz et al. | 716/13 |
| 2007/0136708 A1 * | 6/2007 | Overs et al. | 716/6 |
| 2009/0033398 A1 * | 2/2009 | Dennis et al. | 327/293 |
| 2009/0210840 A1 * | 8/2009 | Berry et al. | 716/6 |

* cited by examiner

*Primary Examiner* — Vuthe Siek
*Assistant Examiner* — Magid Dimyan
(74) *Attorney, Agent, or Firm* — Harrity & Harrity, LLP

(57) ABSTRACT

A computing device may include a memory to store instructions and a processor. The processor may execute the instructions to conduct an initial cell optimization for an integrated circuit layout; designate clock loads associated with a first-level clock buffer; receive, after the initial standard-cell optimization, a set of initial placement locations; align the clock loads according to the set of placement locations; conduct, using the aligned clock loads, a re-optimization of the integrated circuit layout; and store, in the memory, a circuit layout based on the re-optimization.

20 Claims, 10 Drawing Sheets

528

METHOD FOR CLOCK LOAD ALIGNMENT DURING STANDARD CELL OPTIMIZATION

BACKGROUND

Integrated circuits (e.g., miniaturized electronic circuits built into a monolithic semiconductor substrate, such as a silicon chip) are essential for the functionality of many processing systems. A design layout of an integrated circuit may be performed in an automated or semi-automated process using various design software products. Automated systems for producing layouts for an integrated circuit chip may account for numerous factors that provide for mapping, sizing, and placement of components. A design objective generally includes determining an optimal arrangement of components in a plane or a three-dimensional space and an efficient interconnection scheme between the components to provide the desired functionality. Among the components to be arranged in the chip are a large number (e.g., thousands, millions or even billions) of small cells or transistors. Each cell may represent a one or more logic elements, such as a gate, flip-flop, latch, etc., which may perform a specific function. Each cell may include multiple pins or terminals, each of which is connected to pins of other cells by a respective electrical interconnection wire network (or net). A purpose of the optimization process used in the physical design stage of a cell is to determine a cell placement such that all of the required interconnections can be made, but total wire length and interconnection congestion are minimized.

Some processing systems may generate clock signals throughout integrated circuits that include a significant amount of skew relative to the input clock. That is, different components within the integrated circuit may not receive signals from a clock source at the same time. This "clock skew" may be due to a number of causes, including delay induced by on-chip gates and delay induced by on-chip or printed circuit board (PCB) wires.

Clock skew can be accounted for by assuming a worst case delay and synchronizing the clock circuitry accordingly. Thus, during a clock signal process in which less delay than the worst case exists, an unnecessary delay is introduced into the process beyond what is necessary to send/receive the clock signal. This unnecessary delay, when multiplied by numerous data operations, hinders the maximum capability of a data processing system and, thus, limits the quantity of data processed over any given period of time.

SUMMARY

According to one aspect, a method may include conducting, by one or more computing devices, an initial cell optimization for an integrated circuit layout; designating, by the one or more computing devices, multiple clock loads associated with a first level clock buffer; aligning, by the one or more computing devices and after the initial cell optimization, placement of the multiple clock loads; conducting, by the one or more computing devices and using the aligned clock loads, a re-optimization of the integrated circuit layout; and generating, by the one or more computing devices, a circuit layout based on the re-optimization.

According to another aspect, a computing device may include a memory to store instructions and a processor. The processor may execute the instructions to conduct an initial cell optimization for an integrated circuit layout, designate clock loads associated with a first-level clock buffer, receive, after the initial cell optimization, a set of placement locations to align the clock loads in columns, align the clock loads according to the set of placement locations, conduct a re-optimization of the integrated circuit layout using the aligned clock loads, and store, in the memory, a circuit layout based on the re-optimization.

According to still another aspect, a system for aligning clock loads of an integrated circuit may include means for conducting an initial cell optimization for an integrated circuit layout; means for associating clock loads with a first-level clock buffer; means for calculating, after the initial cell optimization, a set of placement locations to arrange the clock loads in columns; means for aligning the clock loads according to the set of placement locations; means for conducting a re-optimization of the integrated circuit layout using the aligned clock loads; and means for generating a circuit layout based on the re-optimization.

According to a further aspect, a computer-readable medium may include one or more instructions for associating clock loads with a first level clock buffer within a particular physical area of an integrated circuit layout; one or more instructions for receiving alignment rules for the clock loads associated with the first-level clock buffer; one or more instructions for, after the initial cell optimization, aligning the clock loads according to the alignment rules; one or more instructions for conducting a re-optimization of the integrated circuit layout using the aligned clock loads; and one or more instructions for generating a circuit layout based on the re-optimization.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements. Also, the following detailed description does not limit the invention.

Implementations described herein may provide systems and/or methods that produce digital integrated circuit (IC) designs with aligned clock loads (e.g., IC cells requiring clock signal inputs) that can reduce latency and skew. During late phases of optimization of technology mapping, sizing, and placement in a standard cell synthesis flow, groups of clock loads may be aligned such that their clock pins can be easily connected to an overhead clock wire with minimum (or zero) length stubs (e.g., wirelines). Thus, the alignment process clock load cells may be integrated with placement of other (e.g., standard) cells. Final standard cell optimization may be performed with these clock loads loosely fixed in place.

The alignment process may be accomplished using small groups of clock loads, which may be arranged in columns or rows. Local groups may be connected with local first-level straps (e.g., wirelines). First-level straps may be grouped together and connected similarly with orthogonal second-level straps. This strapping can continue back to a first-level clock buffer, and may also continue behind the first-level clock buffer, as well. The aligned load grouping may achieve minimum length wires for the clock loads so that clock skew may be minimized.

The term "integrated circuit (IC)," as used herein, may refer to a microprocessor, a field programmable gate array (FPGA), a printed circuit board, an application specific integrated circuit (ASIC), and/or a memory device (e.g., random access memory (RAM), read only memory (ROM), flash memory, etc.) and may sometimes be referred to herein as a "chip" or an "IC chip."

The term "clock skew," as used herein, may be defined as a difference between the earliest and latest times a particular clock cycle sent by a clock source arrives at a particular component on a chip. Clock latency, for a particular IC, may be approximately equal to the largest clock delay associated with a component on the chip, which is often associated with the component that is the farthest from the clock source (e.g., or has the longest wire length from the clock source).

Exemplary Chip Layout

Figure 1:
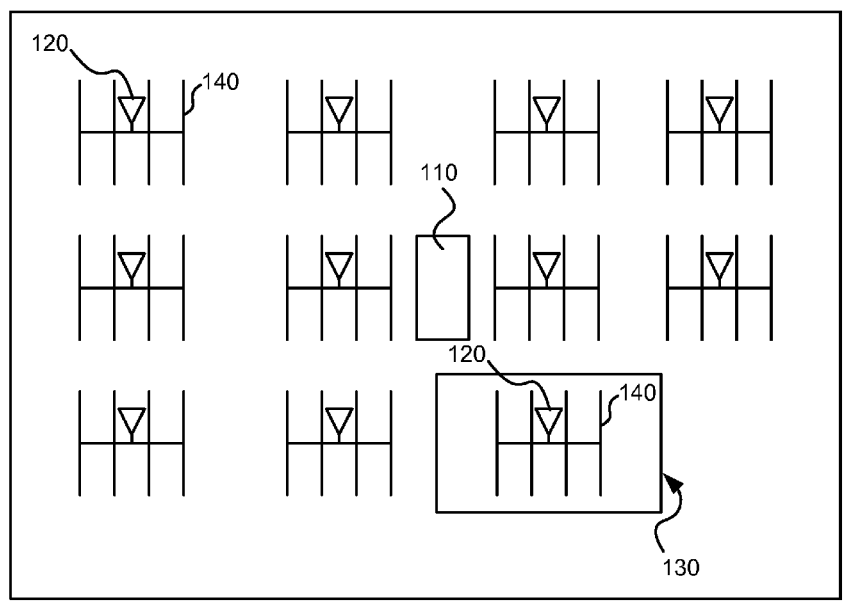
FIG. 1 is a diagram of an exemplary chip layout in which systems and/or methods described herein may be implemented.

FIG. 1 is a diagram of an exemplary integrated circuit layout 100 in which systems and/or methods described herein may be implemented.

A design layout of an integrated circuit may be performed in an automated or semi-automated process using various design software products. For example, a computing device may receive input (e.g., design criteria) from a user and/or other devices, may perform operations based on the input received, and/or may provide output in the form of displaying information, sending notifications, sending information to another device (e.g., a user device, an IC manufacturing device, etc.), and/or storing information. As part of the design process, the design layout may be optimized for cell placement and routing, using, for example, a placement and routing engine. Traditional placement and routing engines may produce unorganized locations for clock loads (e.g., flip-flops, latches, memories, etc). Routers which connect these loads to a clock source frequently generate wires with large variation in length because of the disorganization. Together these result in a large clock skew (e.g., caused by a large variation in minimum to maximum wire lengths), which detracts from desired goals of maximum performance, minimum cell area, and minimum power.

As illustrated in FIG. 1, chip layout 100 may include a master clock source 110 that distributes a clock signal to a plurality of layer 1 clock buffers 120. Clock buffers 120 may include, for example, a buffer, an inverter, or another delay device that may cause a clock signal to be delayed by a predetermined amount of time to reduce skew within the IC and ensure that a synchronous clock signal is communicated to the clock loads within the IC. The clock signal may be distributed, for example, using a clock distribution network of interconnected wires or traces (not shown) in a variety of structures, including a clock mesh or a clock tree. Additional layers, cells, buffers, drivers, gates, etc. (not shown) may be included between clock source 110 and layer 1 clock buffers 120. As part of an initial optimization process for technology mapping, sizing, and placement, each of the layer 1 clock buffers 120 may be associated with a particular physical area, referred to herein as a clock box 130 (or simply "box 130"), within chip layout 100. That is, each of the layer 1 clock buffers 120 may be considered the last clock buffer before the clock signal (from clock source 110) reaches a clock load. Boxes 130 may be different sizes and may be defined, for example, based on factors such as the number of clock loads associated with a particular clock buffer 120, the number of other cells, and/or other components requiring placement. Also, boxes 130 may not be restricted to a particular shape (e.g., box 130 may be a rectangle, square, another geometric shape, or an irregular shape).

Each box 130 may, thus, include a sub-set of clock loads and other cells for the entire chip layout 100. Within each box 130, a set of wirelines 140 may be included to connect clock loads within a corresponding area 130 to each layer 1 clock buffer 120. Alternatively, box 130 may not include a clock buffer 120, such that wirelines 140 may connect to another point in a clock network. The connection of the clock loads to layer 1 clock buffer 120 is discussed further in connection with FIGS. 2 and 3.

A completed chip layout 100 may be sent to a manufacturing environment. In the manufacturing environment, the components, gates, wires, blocks, etc. may be built onto a monolithic substrate (e.g., silicon, sapphire or gallium arsenide) via a variety of IC manufacturing processes. The result is an IC installed on a semiconductor chip. Verification testing may be performed to determine that the chip is performing in accordance with a specification (e.g., clock skew, clock latency, chip speed, etc.).

Although FIG. 1 shows an exemplary configuration of chip layout 100, in other implementations, chip layout 100 may contain fewer components, different components, differently arranged components, or additional components than depicted in FIG. 1.

Figure 2:
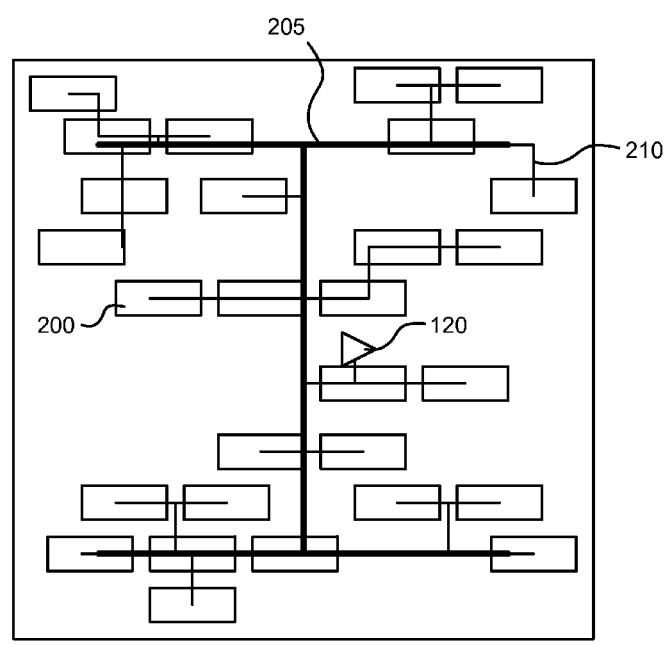
FIG. 2 is a diagram of a pre-optimized portion of the chip layout of FIG. 1.

FIG. 2 provides a simplified diagram of a pre-optimized portion of a box 130 of chip layout 100 of FIG. 1. As shown in FIG. 2, in a conventional chip layout, a connecting spine 205 may be positioned to provide a connection for a group of clock loads 200. The connecting spine 205 may be positioned so that pins for each clock load may be connected via a wireline to connecting spine 205. In one implementation each of clock loads 200 may be a single flip-flop. Initial placement of clock loads 200 may define a subset of clock loads 200— from the overall set of cells in chip 100—that is assigned to a particular box 130. While only clock loads 200 are shown in FIG. 2, other cells (not shown) may also be included within the layout for the physical space defined by box 130. For example, a particular box 130 may include a relatively small number of clock loads 200 (e.g., a few hundred) compared to the number of total cells (e.g., several thousand). Also, within each box 130, there may be notable differences in the number of clock loads 200 and/or percentage of clock loads 200 compared to other boxes 130.

As shown in FIG. 2, connecting spine 205 may be in the form of a preconfigured H-tree. An H-tree may be used as a pre-configured routing structure to provide a routing path from clock buffer 120 to individual clock loads 200 with a minimal amount of individual wirelines 210. As described further herein, routing and placement engines generally performing a standard cell synthesis may provide an unorganized initial placement of clock loads 200 within each box 130. For example, clock loads 200 may be intermingled in no discernable order among other cells within box 130. Given this initial placement, routing and placement engines which connect each clock load 200 to layer 1 clock buffer 120 may seek to use the shortest wireline from a pin of a clock load 200 to another wireline or connecting spine 205. While an H-tree configuration of connecting spine 205 may be used in an attempt to accommodate the pre-optimized clock load placements, this combination of unorganized initial placement and wireline routing can leave a layout with an undesirably large clock skew (e.g., due to a large variation between a minimum clock-load-to-buffer route and a maximum clock-load-to-buffer route). Thus, the simplified configuration of FIG. 2 may benefit from further optimization of clock load placement prior to performing an automated routing procedure.

Although FIG. 2 shows exemplary components of box 130, in other implementations, box 130 may contain fewer components, different components, differently arranged components, or additional components than depicted in FIG. 2. Alternatively, or additionally, one or more components of box 130 may perform one or more other tasks described as being performed by one or more other components of box 130.

Figure 3:
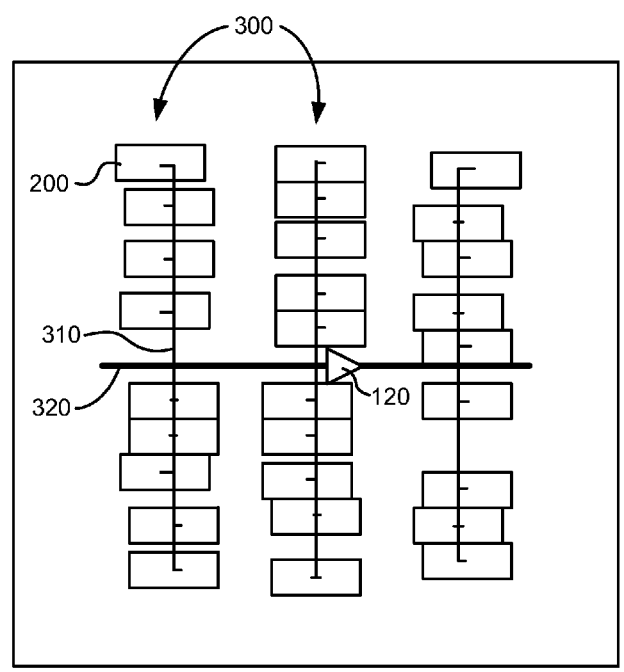
FIG. 3 is a diagram of an optimized portion of the chip layout of FIG. 2.

FIG. 3 provides a simplified diagram of an optimized portion of a box 130 of chip layout 100 of FIG. 1. After an initial optimization (e.g., FIG. 2) defines cell placement and general locations (e.g., within each box 130) of clock loads 200, clock load 200 locations may then be optimized within each box 130. As shown in FIG. 3, clock loads 200 within box 130 may be ordered into groups 300 and aligned into columns. (While descriptions herein refer to alignment by columns, in other implementations, alignment by rows may be used.) Clock load groups 300 may be defined, for example, based on the number of clock loads in a particular box 130, the physical size of the particular box 130, other cell placements, etc. For example, the number of clock loads 200 in a group 300 may be defined, at least in part, by the number of cells that may fit in a particular dimension (e.g., an X (width) or Y (height) dimension of box 130). Thus, the number of clock loads 200 within a group 300 may vary between groups within each box 130. Also, the number of groups 300 may vary between particular boxes 130.

In one implementation, the height of each column may be defined based on the standard cell height (e.g., Y dimension), the number of cells in each clock load group, and/or an additional set margin. Locations for the columns may be defined based on, for example, the number of groups and/or the defined column height. Columns may be, for example, evenly spaced along a dimension (e.g., width) of box 130. In other implementations, columns for groups 300 may be spaced symmetrically or asymmetrically in relation to a center line of box 130.

Movement of clock loads 200 from their location after initial optimization (shown in FIG. 2) to columns for groups 300 may be performed using automated (a separate placement algorithm implemented on a computer) or semi-automated (e.g., scripted) processes applied separately to each box 130. For example, locations and height of columns may be defined and groups 300 of clock loads 200 may be assigned to each column location.

Once each group 300 is arranged in a column, a local first-level strap 310 may be designated along each column to eventually connect each clock load 200 within each group 300. Each of the first-level straps 310 may be linked together and connected with a second-level strap 320 that is preferably orthogonal to the first-level straps 310. In one implementation, first-level straps 310 and second-level strap 320 may be used instead of, for example, the conventional connecting spine 205. Each of straps 310 and 320 may be a thick conductive wire with negligible delay characteristics that may be sized in proportion to the box 130 to which it corresponds. Second level strap 320 may link to buffer 120, and may, in one implementation, continue further to a higher level buffer and/or another box 130. Thus, straps 310 and 320 may be used instead of the pre-configured connecting spine 205 discussed above in connection with FIG. 2.

After groups 300 are aligned as columns and first-level straps 310 and second-level strap 320 are applied, a re-optimization process may be conducted (e.g., by a placement engine), since original locations have been disturbed. During the re-optimization process, the aligned clock-loads 200 may be generally maintained in their positions and routing paths to each clock load 200 may be established, such that routing advantages of the aligned locations may not be compromised. Performing alignment of clock loads 200 in pre-routing, such that the alignment may be part of an overall optimization flow according to an implementation described herein, may provide an overall circuit, represented by netlist (e.g., describing the connectivity of the electronic design). The placement of the cells overall may, thus, meet timing requirements and provide low skew in a clock route and good routability of all the signals related to the clock loads.

Although FIG. 3 shows exemplary components of box 130, in other implementations, box 130 may contain fewer components, different components, differently arranged components, or additional components than depicted in FIG. 3. Alternatively, or additionally, one or more components of box 130 may perform one or more other tasks described as being performed by one or more other components of box 130.

Exemplary Computing Device

Figure 4:
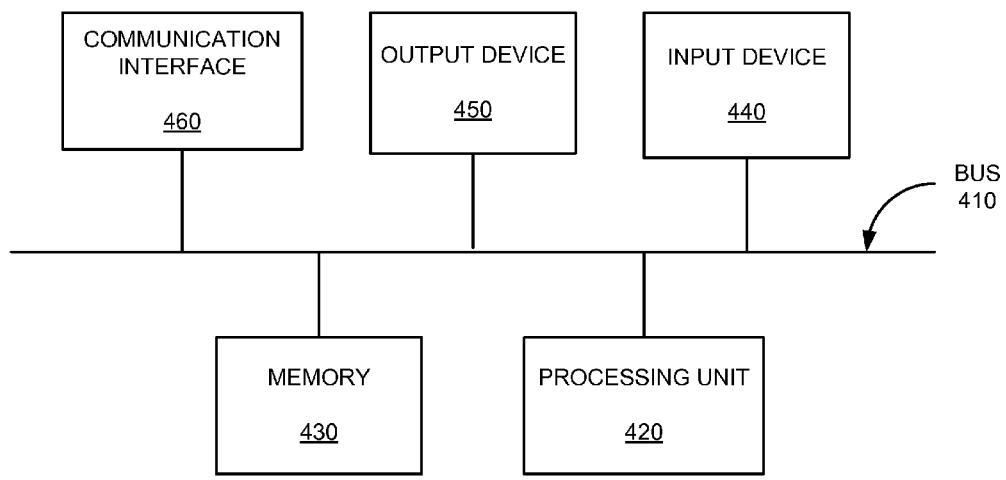
FIG. 4 is a diagram of exemplary components of a computing device in which systems and/or methods described herein may be implemented.

FIG. 4 is a diagram of an exemplary computing device 400 that may be used to conduct placement and optimization of cells on chip layout 100. As shown, exemplary computing device 400 may include a bus 410, a processing unit 420, a memory 430, an input device 440, an output device 450, and a communication interface 460.

Bus 410 may permit communication among components of computing device 400. Processing unit 420 may include one or more processors or microprocessors that interpret and execute instructions.

Memory 430 may include a RAM or another type of dynamic storage device that stores information and instructions for execution by processing unit 420, a ROM or another type of static storage device that stores static information and instructions for the processing unit 420, and/or some other type of magnetic or optical recording medium and its corresponding drive for storing information and/or instructions.

Input device 440 may include a device that permits information to be input to computing device 400. Output device 450 may include a device that outputs information from computing device 400. Communication interface 460 may include any transceiver-like mechanism that enables computing device 400 to communicate with other components, devices, and/or systems.

As described herein, computing device 400 may perform certain operations in response to processing unit 420 executing software instructions contained in a computer-readable medium, such as memory 430. A computer-readable medium may be defined as a physical or logical memory device. A logical memory device may include memory space within a single physical memory device or spread across multiple physical memory devices. The software instructions may be read into memory 430 from another computer-readable medium or from another device via communication interface 460. The software instructions contained in memory 430 may cause processing unit 420 to perform processes described herein. Alternatively, hardwired circuitry may be used in place of or in combination with software instructions to implement processes described herein. Thus, implementations described herein are not limited to any specific combination of hardware circuitry and software.

Although FIG. 4 shows exemplary components of computing device 400, in other implementations, computing device 400 may contain fewer components, different components, differently arranged components, or additional components than depicted in FIG. 4. Alternatively, or additionally, one or more components of computing device 400 may perform one or more other tasks described as being performed by one or more other components of computing device 400.

Exemplary Functional Components of Computing Device

Figure 5A:
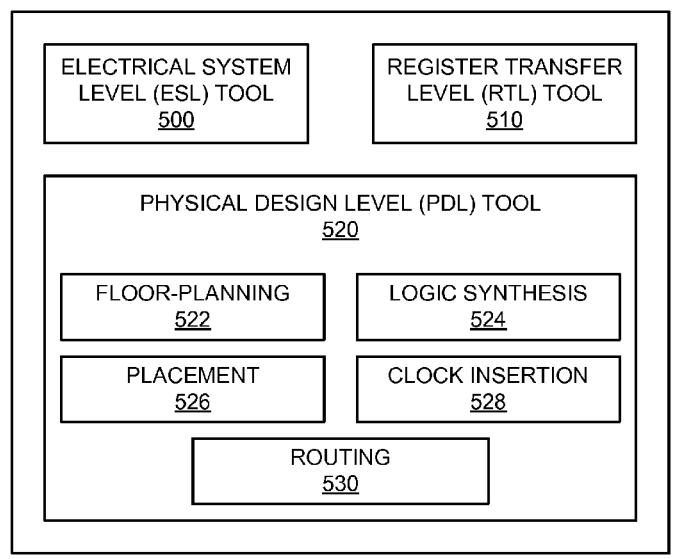
FIGS. 5A and 5B are diagrams of exemplary functional components of the computing device of FIG. 4.

FIG. 5A is a diagram of exemplary functional components of computing device 400. In one exemplary implementation, the functions described in connection with FIGS. 5A and 5B may be performed by one or more of the components depicted in FIG. 4. Computing device 400 may include various IC design tools (e.g., placement and routing engines, register transfer level tools, static timing analysis tools, etc.) associated with an electronic design automation process (hereinafter referred to as an "EDA process"). The IC design tools associated with the EDA process may be connected to an IC manufacturing environment in which IC design information generated by the EDA process may be sent to the IC manufacturing environment and an IC may be manufactured using the IC design information. As shown in FIG. 5A, computing device 400 may include an electrical system level (ESL) tool 500, a register transfer level (RTL) tool 510, a physical design level (PDL) tool 520, and/or other tools 530.

ESL tool 500 may receive customer requirements and generate a specification for an IC that addresses the customer requirements. RTL tool 510 may develop (e.g., from the specification) a logical description of the operation and/or behavior of the IC that can, at a later point, be implemented by hardware and/or a combination of hardware and software. Additionally, or alternatively, RTL tool 510 may describe how signals within the IC travel between registers and/or other IC components to execute the logical description.

PDL tool 520 may include a number of stages that generate an IC design that can be manufactured and that can execute the logical description (e.g., from RTL tool 510) in conformance with the specification (e.g., from ESL tool 500). For example, PDL tool 520 may include a floor-planning stage 522, a logic synthesis stage 524, a placement stage 526, a clock insertion stage 528, and a routing stage 530. While PDL tool 520 is described as including stages 522-530, in other implementations, fewer stages, different stages, additional stages or differently arranged stages may be associated with PDL tool 520. Additionally, the manner in which the stages, associated with the PDL phase, are performed may be modified from that discussed herein. For example, the order of the stages may be changed, execution of one or more operations may be repeated, one or more stages may not be executed, and/or one or more stages may be performed in an iterative or interactive manner.

Floor-planning stage 522 may divide the chip into regions and/or a set of blocks in which various components (e.g., I/O pads, arrays, central processing unit (CPU), logic circuits, memory components, etc.) of the IC may be placed to realize the RTL of the IC. Logic synthesis stage 524 may generate a gate-level netlist of components that may execute the operations required by RTL tool 510.

Placement stage 526 may generate placement layout information corresponding to a specific location that logic gates and/or other components, indentified in the netlist, may be integrated into the chip. The placement layout information may include cell dimensions and location information that minimizes wire length, temperature gradients and/or power consumption associated with cell placement within an IC.

Clock insertion stage 528 may include a number of operations that enable the insertion of a clock distribution network within the IC in a manner that minimizes clock skew and/or clock latency. The clock distribution network may include, for example, a clock mesh/clock tree, clock buffers (e.g., clock buffers 120), connecting spines (e.g., straps 310/320), and/or other wires to connect clock loads (e.g., clock loads 200) identified in the placement layout information, to a connecting spine so that clock signal inputs may be received. Clock insertion stage 528 is discussed further below in connection with FIG. 5B.

Routing stage 530 may insert wire plans to interconnect the logic gates identified in the netlist and placed on the chip with cells installed by floor-planning stage 522. Routing stage 530 may ensure that the routing can be reproduced in the manufacturing environment.

Figure 5B:
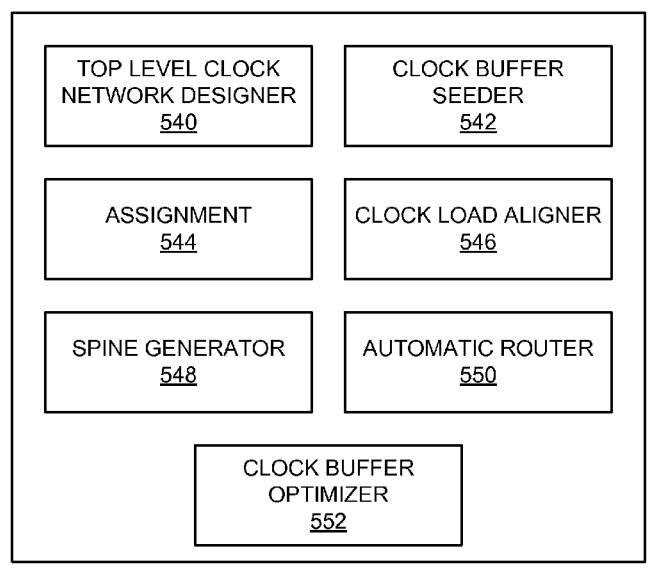

FIG. 5B provides a diagram of exemplary functional components of clock insertion stage 528. Clock insertion stage 528 may include a number of operations associated with generating a clock distribution network that minimize clock skew and/or clock latency for components installed in an IC. For example, as illustrated in FIG. 5B, clock insertion stage 528 may include a top-level clock network designer 540, a clock buffer seeder 542, a logical mapping 544, a clock load aligner 546, a spine generator 548, an automatic router 550, and/or a clock buffer optimizer 552.

Top-level clock network designer 540 may, for example, use the placement layout information generated during placement stage 526 to determine a cell density for the entire area of the chip, for a particular region of the chip, and/or for a block installed on the chip. Based on the cell density information, top-level clock network designer 540 may generate a clock network (e.g., a conductive grid, mesh, tree, and/or other pattern of wires) with a particular pattern or density that distributes the clock signal in close proximity to most or all of the clock loads (e.g., clock loads 200) to be installed on the chip to minimize clock skew and/or clock latency. Furthermore, based on the clock network and/or cell density information, top-level clock network designer 540 may generate a drop point array in which conductive contacts, connected to each wire of the clock network, are inserted into each block 100 and/or in the proximity of each box 130, at controlled and/or uniform interval, along the clock grid.

Clock buffer seeder 542 may automatically seed the drop point array by connecting a clock buffer to each drop point of the drop point array. For example, clock loads 200 that are in close proximity to the clock source and/or a nearest drop point may require a particular amount of delay in the clock signal, which determines the size of the particular clock buffer. However, clock loads that are farther away from the clock source and/or a nearest drop point may require less delay (e.g., and thus, a buffer that is different/larger than the particular buffer) due to the additional time required for the clock signal to reach the more distant clock load. Sizing the clock buffers appropriately may reduce skew and/or may enable a synchronous clocking signal to be communicated to the clock loads within the IC.

Assignment 544 may, for example, assign each clock load 200 to the nearest clock buffer 120 (e.g., the nearest clock buffer attached to a drop point) and may generate boxes (e.g., boxes 130) of appropriate size for each clock buffer 200 based on the logical mapping operation (e.g., the number of clock loads 200 logically mapped to a particular clock buffer 120 and/or the proximity of the clock loads 200 to the particular clock buffer 120).

Clock load aligner 546 may receive (e.g., based on direct user input and/or program input) location information for clock loads 200 within each box 130 and may reposition the clock loads in accordance with the alignment information. For example, using the assignment information (e.g., clock buffer 120 locations, box 130 dimensions, etc.), numbers/locations/heights of columns within each box 130 may be defined and groups (e.g., groups 300) of clock loads 200 may be assigned to each column location. Clock load aligner 546 may perform minor (e.g., within a box 130) relocation of clock loads 200 to achieve alignment within the particular column specifications.

Spine generator 548 may apply local first-level straps (e.g., straps 310) along each column and an orthogonal second-level strap (e.g., strap 320) within each box 130 to connect the local clock buffer 120 to each clock load 200 within a corresponding box 130.

Automatic router 550 may perform an automatic routing operation in which each clock load 200 within a particular box 130 is connected to local clock buffer 120. Automatic router 550 may route connections, for example, from each clock load 200, via a wire etched into the IC, to a corresponding first level strap (e.g., one of straps 310) which, in turn, connect to a second-level strap (e.g., strap 320).

When all clock loads are routed to a corresponding strap, clock buffer optimizer 552 may compute the input electrical characteristics (e.g., resistance, capacitance, etc.) for each set of straps 310/320 and a wireline distribution corresponding to each clock buffer 120 (e.g., clock loads connected to each clock buffer 120) and may resize local clock buffer 120 to ensure that a clock signal reaches each clock load with minimal skew.

While FIGS. 5A and 5B illustrate exemplary functional components of computing device 400, in other implementations, fewer, different, differently arranged, or additional functional components may be associated with computing device 400. Alternatively, or additionally, one or more functional components of computing device 400 may perform one or more other tasks described as being performed by one or more other functional components of computing device 400. Furthermore, the manner in which the operations of the functional components are performed may be modified from that discussed herein. For example, the order of the operations may be changed, performance of one or more operations may be repeated, one or more operations may not be performed, and/or one or more operations may be performed in an iterative manner.

Exemplary Process

Figure 6:
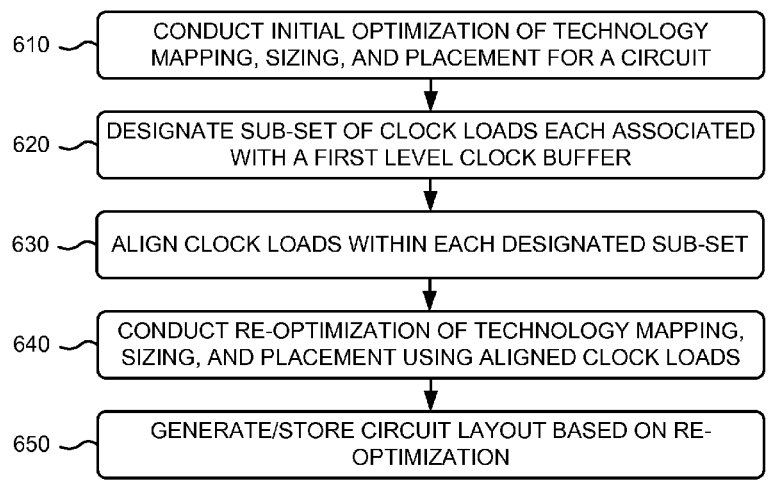
FIGS. 6 and 7 are flow charts of an exemplary process for performing load alignment during standard cell optimization according to an implementation described herein.
Figure 7:
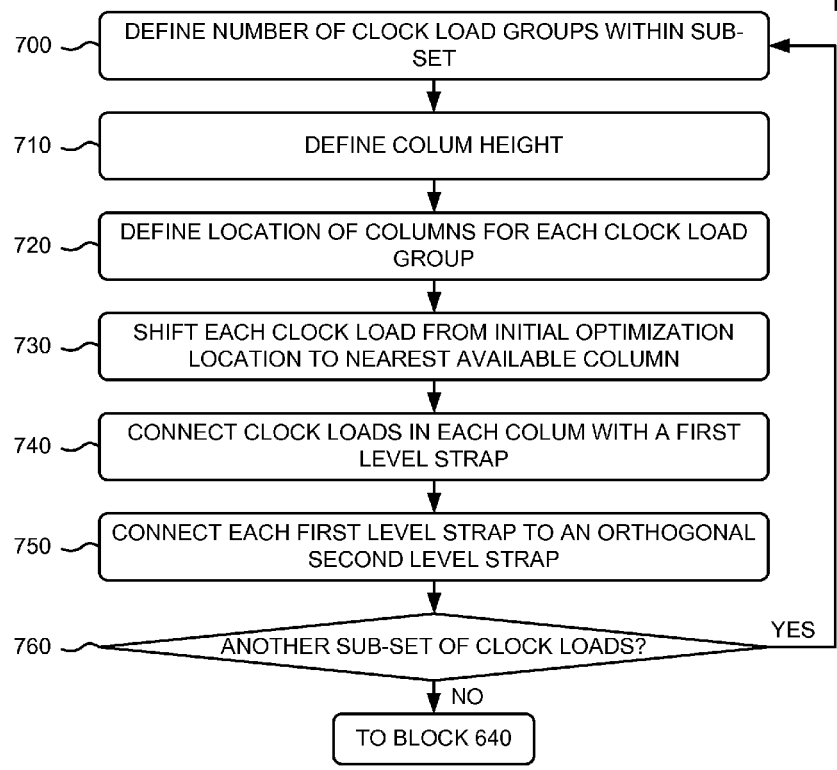

FIGS. 6 and 7 are flow charts of an exemplary process 600 for performing load alignment during standard cell optimization according to an implementation described herein. In one implementation, process 600 may be performed by computing device 400 (FIG. 4). In another implementation, some or all of process 600 may be performed by one or more other devices, including or excluding computing device 400, such as, for example, devices operating in parallel.

As illustrated in FIG. 6, process 600 may include conducting initial optimization of technology mapping, sizing, and placement for a circuit (block 610), and designating a sub-set of clock loads each associated with a first level clock buffer (block 620). As further shown in FIG. 6, process 600 may include aligning the clock loads within each designated sub-set (block 630). Process block 630 may include the process blocks depicted in FIG. 7. As shown in FIG. 7, process block 630 may include defining a number of clock load groups with the sub-set (block 700), defining a column height (block 710), and defining a location of columns for each clock load group (block 720). For example, in implementations described above in connection with FIG. 3, clock load 200 locations may be optimized within each box 130. In one example, clock loads 200 within box 130 may be ordered into groups 300 and aligned into columns. Clock load groups 300 may be defined, for example, based on the number of clock loads in a particular box 130, the physical size of the particular box 130, other cell placements, etc. For example, the number of clock loads 200 in a group 300 may be defined, at least in part, by the number of cells that may be contained within a particular dimension (e.g., an X (width) and/or Y (height) dimension of box 130). Thus, the number of clock loads 200 within a group 300 may vary between groups within each box 130. Also, the number of groups 300 may vary between particular boxes 130. In one implementation, the height of each column may be defined based on the standard cell height (e.g., Y dimension), the number of cells in each clock load group, and/or an additional set margin. Locations for the columns may be defined based on, for example, the number of groups and/or the defined column height. Columns may be, for example, evenly spaced along a dimension (e.g., width) of box 130. In other implementations, columns for groups 300 may be spaced symmetrically or asymmetrically in relation to a center line of box 130.

Continuing with FIG. 7, process block 630 may further include shifting each clock load from the initial optimization location to a nearest available column (block 730), connecting clock loads in each column with a first level strap (block 740), and connecting each first level strap to an orthogonal second level strap (block 750). For example, in implementations described above in connection with FIG. 3, each group 300 may be aligned in a column, as shown in FIG. 3. Movement of clock loads 200 from their location after initial optimization to columns for groups 300 may be performed using an automated (a separate placement algorithm implemented on a computer) or semi-automated (e.g., scripted) processes applied separately to each box 130. For example, locations and height of columns may be defined and groups 300 of clock loads 200 may be assigned to each column location. Once each group 300 is arranged in a column, a local first-level strap 310 may be designated along each column to eventually connect each clock load 200 within each group 300. Each of the first-level straps 310 may be linked together and connected with a second-level strap 320 orthogonal to the first-level straps 310. Second level strap 320 may link to buffer 120, and may, in one implementation, continue further to a higher level buffer and/or another box 130.

Continuing with FIG. 7, it may be determined if another sub-set of clock loads (e.g., another box 130) requires alignment (bock 760). If it is determined that another box 130, remains to be aligned (block 760—YES), process block 630 may return to block 700 to resume alignment of other clock loads within another box 130. If it is determined that there are no other boxes 130 remaining to be aligned (block 760—YES), process block 630 may proceed to block 640 of FIG. 6.

Returning again to FIG. 6, process 600 may include conducting a re-optimization of the technology mapping, sizing, and placement using the aligned clock loads (block 640), and generating and/or storing a circuit layout based on the re-optimization (block 650). For example, in implementations described above in connection with FIG. 3, after the groups 300 are aligned as columns and the first-level straps 310 and second-level straps 320 applied, a re-optimization process may be conducted (e.g., by a placement engine), since original locations have been disturbed. During the re-optimization process, the aligned clock-loads 200 may be generally maintained in their positions and routing paths to each clock load 200 established, such that routing advantages of the aligned locations may not be compromised. Performing alignment of clock loads 200 in pre-routing, such that the alignment may be part of an overall optimization flow according to an implementation described herein, may provide an overall circuit, represented by a netlist and/or position list.

EXAMPLE

Figure 8:
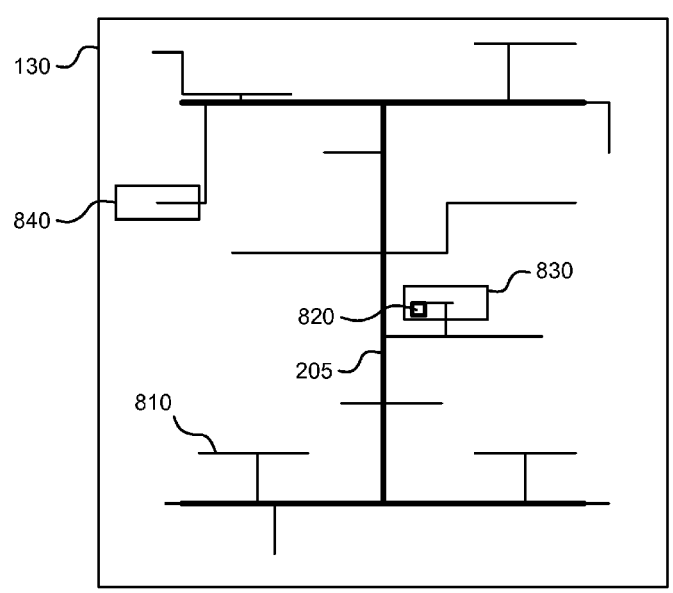
FIG. 8 is a wireline diagram of a pre-optimized portion of the chip layout of FIG. 2.

FIG. 8 provides a wireline diagram 800 of a pre-optimized portion of a chip layout. Wireline diagram 800 may correspond, for example, to the clock load arrangement box 130 of FIG. 2 that relies on a pre-configured H-tree. As shown in FIG. 8, box 130 may include conventional connecting spine 205 and other wirelines 810 that are used to connect a pin 820 of a first-layer clock buffer (e.g., buffer 120, not shown) to multiple clock loads, within box 130, that include a nearest clock load 830 and a farthest clock load 840. The skew for wireline diagram 800 may be represented generally by the difference between the distance from pin 820 to the nearest clock load 830 and the distance from pin 820 to the farthest clock load 840. The pre-optimized placement in wireline diagram 800 may leave a roundabout path from the farthest cloak load 840 to pin 820 that, when compared to the negligible distance from pin 820 to the nearest clock load 830, may result in a high skew value.

Figure 9:
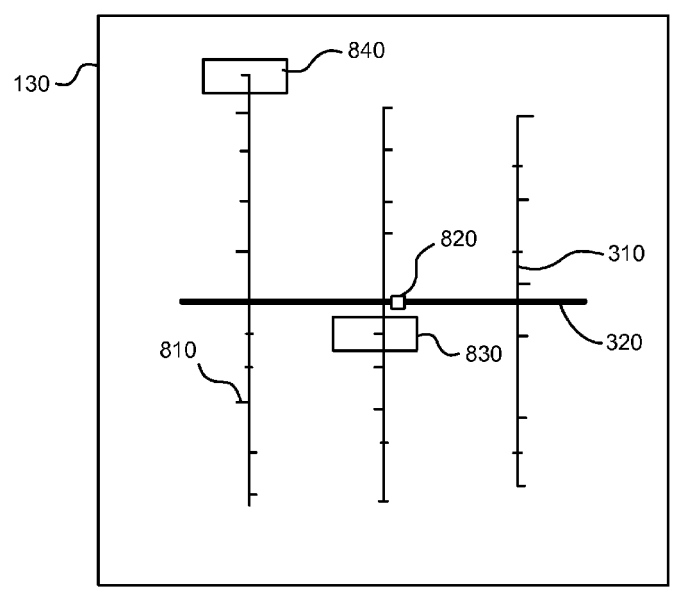
FIG. 9 is a wireline diagram of an optimized portion of the chip layout of FIG. 3.

In contrast, FIG. 9 provides a wireline diagram 900 of an optimized portion of a chip layout. Wireline diagram 900 may correspond, for example, to the clock load arrangement box 130 of FIG. 3. As shown in FIG. 9, box 130 may include first-level straps 310, second level strap 320, and other wirelines 810 that are used to connect pin 820 of a first-layer clock buffer (e.g., buffer 120, not shown) to multiple clock loads, within box 130, that include a nearest clock load 830 and a farthest clock load 840. The optimized placement in wireline diagram 900 may provide a more compact group of routes for the clock loads within box 130. Thus, the skew value may be minimized. The alignment shown in wireline diagram 900 may significantly enhance routability when, as is frequently the case, not only a single clock, but multiple clocks and test-related signals must connect in an organized fashion to many clock loads.

CONCLUSION

Implementations described herein may include systems and/or methods that may conduct an initial standard-cell optimization for an integrated circuit layout; may designate clock loads associated with a first-level clock buffer; may receive, after the initial standard-cell optimization, a set of placement locations of the clock loads; may align the clock loads into columns based on the initial set of placement locations; may conduct, using the aligned clock loads, a re-optimization of the integrated circuit layout; and may store, in the memory, a circuit layout based on the re-optimization. Location-specific alignment may customize the location and number of columns of clock loads such that cell movement associated with alignment may be minimized. Cells may be sorted by original location, grouped according to the desired column height, and columnized within each group. Each group may receive an optimal location that minimizes overall cell movement.

The foregoing description of implementations provides illustration and description, but is not intended to be exhaustive or to limit the invention to the precise form disclosed. Modifications and variations are possible in light of the above teachings or may be acquired from practice of the invention.

For example, while series of blocks have been described with regard to FIGS. 6 and 7, the order of the blocks may be modified in other implementations. Further, non-dependent blocks may be performed in parallel. For example, the buffers 130 may only be virtual, and not realized. For example, the entire process may be done (or repeated) at a different level of clock network buffering.

It will be apparent that exemplary aspects, as described above, may be implemented in many different forms of software, firmware, and hardware in the embodiments illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:
conducting, by one or more computing devices, an initial cell optimization for an integrated circuit layout;
designating, by the one or more computing devices, a plurality of clock loads associated with a first level clock buffer;
aligning, by the one or more computing devices and after the initial cell optimization, placement of the plurality of clock loads;
conducting, by the one or more computing devices and using the aligned clock loads, a re-optimization of the integrated circuit layout; and
generating, by the one or more computing devices, a circuit layout based on the re-optimization.

2. The method of claim 1, where aligning placement of the plurality of clock loads further comprises:
defining clock load groups within the plurality of clock loads,
associating each of the clock load groups with one of a plurality of columns,
defining a location of each of the plurality of columns, and shifting each clock load, of each of the clock load groups, from a location of the initial optimization to a location in a column associated with a corresponding clock load group.

3. The method of claim 2, where aligning placement of the plurality of clock loads further comprises:
connecting clock loads in each column with a first level strap, and
connecting each first level strap to a second level strap provided orthogonally to each first level strap.

4. The method of claim 3, where aligning placement of the plurality of clock loads further comprises:
receiving a set of placement locations for the plurality of clock loads and generating a corresponding set of aligned locations.

5. The method of claim 2, where the clock load groups are defined based on the location of the clock loads resulting from the initial optimization.

6. The method of claim 1, where the re-optimization includes providing efficient wire routing for the plurality of clock loads.

7. The method of claim 1, where the aligned clock loads maintain the aligned placement during the re-optimization.

8. A computing device, comprising:
a memory to store instructions; and
a processor to execute the instructions to:
conduct an initial cell optimization for an integrated circuit layout,
designate a plurality of clock loads associated with a first-level clock buffer,
receive, after the initial cell optimization, a set of placement locations to align the plurality of clock loads in columns,
align the plurality of clock loads according to the set of placement locations,
conduct, using the aligned plurality of clock loads, a re-optimization of the integrated circuit layout, and
store, in the memory, a circuit layout based on the re-optimization.

9. The computing device of claim 8, the set of placement locations including:
clock load groups within the plurality of clock loads, where each clock load group is associated with a column,
a column location for each of the clock load groups, and
a height limit for each column.

10. The computing device of claim 9, where the clock load groups are defined based on the location of the clock loads resulting from the initial optimization.

11. The computing device of claim 8, where the set of placement locations are included as a change list.

12. The computing device of claim 8, the processor is further to:
connect clock loads in each column with a first level strap, and
connect each first level strap to a second level strap, where the second level strap connects to the first-layer clock buffer.

13. The computing device of claim 8, where the re-optimization includes providing cell routing for the plurality of clock loads.

14. The computing device of claim 13, where the processor is further to:
maintain the position of the clock loads during the re-optimization.

15. A system for aligning clock loads of an integrated circuit, comprising:
at least one device to:
conduct an initial cell optimization for an integrated circuit layout;
associate a plurality of clock loads with a first-level clock buffer;
calculate, after the initial cell optimization, a set of placement locations to arrange the plurality of clock loads in columns;
align the plurality of clock loads according to the set of placement locations;
conduct, using the aligned plurality of clock loads, a re-optimization of the integrated circuit layout; and
generate a circuit layout based on the re-optimization.

16. The system of claim 15, where the at least one device is further to:
apply a second-level strap from the first-level clock buffer; and
apply a first-level strap to connect each of the columns to the second-level strap.

17. A non-transitory computer-readable medium storing instructions, the instructions comprising:
one or more instructions which, when executed by a processor, cause the processor to associate a plurality of clock loads with a first level clock buffer within a particular physical area of an integrated circuit layout;
one or more instructions which, when executed by the processor, cause the processor to receive alignment rules for the plurality of clock loads associated with the first-level clock buffer;
one or more instructions which, when executed by the processor, cause the processor to align, after the initial cell optimization, the plurality of clock loads according to the alignment rules;
one or more instructions which, when executed by the processor, cause the processor to conduct, and using the aligned plurality of clock loads, a re-optimization of the integrated circuit layout; and
one or more instructions which, when executed by the processor, cause the processor to generate a circuit layout based on the re-optimization.

18. The computer-readable medium of claim 17, where the instructions further comprise:
one or more instructions to conduct, prior to receiving the alignment rules, an initial cell placement for the integrated circuit layout.

19. The computer-readable medium of claim 17, where the instructions further comprise:
one or more instructions to route the aligned plurality of clock loads to the first-level clock buffer using a single second-layer strap connecting a plurality of first-layer straps.

20. The computer-readable medium of claim 17, where the instructions further comprise:
one or more instructions to associate clock load groups by locality,
one or more instructions to define multiple clock load groups within the plurality of clock loads,
one or more instructions to associate each of the multiple clock load groups with one of a plurality of columns, and
one or more instructions to define a location, within the particular physical area, of each of the plurality of columns.

* * * * *